(12) United States Patent
Gorman et al.

(10) Patent No.: US 7,527,877 B2
(45) Date of Patent: May 5, 2009

(54) PLATINUM GROUP BOND COAT MODIFIED FOR DIFFUSION CONTROL

(75) Inventors: Mark D. Gorman, West Chester, OH (US); Romgopal Darolia, West Chester, OH (US); Michael F. Gigliotti, Scotia, NY (US); Liang Jiang, Schenectady, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/553,515

(22) Filed: Oct. 27, 2006

(65) Prior Publication Data

US 2008/0102306 A1    May 1, 2008

(51) Int. Cl.
  *F03B 3/12*     (2006.01)
  *B32B 15/00*    (2006.01)
  *B32B 15/01*    (2006.01)
(52) U.S. Cl. .............. 428/670; 416/229 R; 416/241 R; 428/678; 428/680; 428/681; 428/685; 428/632; 428/633; 428/215; 428/220; 428/332; 428/335; 428/336; 428/700
(58) Field of Classification Search .............. 428/670, 428/678, 680, 681, 685, 632, 633, 215, 220, 428/332, 335, 336, 700; 416/241 R, 229 R
See application file for complete search history.

(56) References Cited

U.S. PATENT DOCUMENTS

| | | | |
|---|---|---|---|
| 5,856,027 A | 1/1999 | Murphy | |
| 5,942,337 A | 8/1999 | Rickerby et al. | |
| 5,981,091 A * | 11/1999 | Rickerby et al. | ............ 428/670 |
| 6,168,874 B1 | 1/2001 | Gupta et al. | |
| 6,458,473 B1 | 10/2002 | Conner et al. | |
| 6,881,452 B2 | 4/2005 | Spitsberg | |
| 6,921,586 B2 | 7/2005 | Zhao et al. | |
| 6,933,052 B2 | 8/2005 | Gorman et al. | |
| 6,933,062 B2 | 8/2005 | Nagaraj et al. | |
| 6,969,558 B2 | 11/2005 | Walston et al. | |
| 6,974,636 B2 | 12/2005 | Darolia et al. | |
| 7,011,894 B2 | 3/2006 | Saint Ramond et al. | |
| 2003/0079810 A1* | 5/2003 | Jackson et al. | .............. 148/430 |
| 2005/0132717 A1* | 6/2005 | Saint Ramond et al. | ....... 60/805 |

FOREIGN PATENT DOCUMENTS

EP       0905281     3/1999

* cited by examiner

*Primary Examiner*—Timothy M Speer
*Assistant Examiner*—Gordon R Baldwin
(74) *Attorney, Agent, or Firm*—McNees Wallace & Nurick, LLC

(57) ABSTRACT

A modified platinum group metal coating composition comprising a phase having a solid solution face-centered cubic (fcc) crystal structure, rich in platinum group materials. In order to be effective, the platinum group metal coating material was modified based on the chemical composition and chemical activity of the substrate material. The platinum group metal coating material was modified to include, in solid solution, elements of the superalloy substrate, specifically nickel (Ni) and cobalt (Co). Depending on the substrate material, the modified platinum group metal coating material may not even include Ni or Co, but may be modified to include amounts of different elements that are consistent with the chemical composition of the substrate. The modified platinum metal coating material also includes aluminum (Al). The composition may include small amounts of a second phase isolated within the fcc phase matrix.

14 Claims, 9 Drawing Sheets

PLATINUM GROUP BOND COAT MODIFIED FOR DIFFUSION CONTROL

STATEMENT REGARDING FEDERALLY FUNDED DEVELOPMENT

The United States Government may have certain rights in this invention pursuant to Government Contract No. F-33615-03-D-2352 awarded by the Department of Defense.

FIELD OF THE INVENTION

The present invention is directed to a deposited substantially solid solution platinum-group metal coating that is rich in platinum-group metal while also including elements of the base metal substrate that provides reduced interdiffusion between the coating and the substrate.

BACKGROUND OF THE INVENTION

Bond coats are applied over substrate base metals used in gas turbine engines. These bond coats are applied for various purposes, having different compositions, the composition depending upon its purpose. When used on components located in the hot section of an aircraft engine, the turbine portion, these bond coats are used for environmental protection and as a surface for application of a thermal barrier coating (TBC) that enhances the adhesion of the TBC to the component.

Many different varieties of bond coats have been devised, frequently differing only subtlety in composition, microstructure, method of application or mechanical feature. One common problem is that applied thermal barrier coatings tend to spall from the surface of the component. This can occur for any one of a variety of reasons. For example, one identified problem has been the adverse effect of sulfur from the complex substrate chemistry, typically a superalloy material, into the bond coat, which was associated with premature spallation of applied TBC. While many problems with different proposed solutions have been identified, the frequently identified problem to be solved is the retention of TBC on a turbine component in the hot, environmentally deleterious environment in the turbine section of a gas turbine engine such as an aircraft engine.

Resulting changes in the chemistry of both the substrate and the bond coat due to diffusion of elements from the complex substrate chemistry, typically a superalloy material, into the bond coat at the elevated temperatures of turbine operation remains problematic. These coatings frequently are aluminum bearing materials from the class of diffusion aluminides, including modified versions that include platinum-type metals and overlay aluminides such as NiAlCrZr and MCrAlY (where M is at least one of Ni, Co and Fe). These coatings are designed to take advantage of the excellent environmental properties of alumina or aluminum oxide ($Al_2O_3$) which forms at the surface. However, the capability of such environmental coatings is generally limited by the depletion of the active elements, typically aluminum through its continued oxidation at the surface as spalling and diffusion of the aluminum into the substrate occurs. But, diffusion of aluminum into the substrate can also result in detrimental secondary reaction zones (SRZs) forming in newly-developed superalloys. The capability of the coating as a bond coat for a TBC is also limited by a thickening of the thermally grown diffusion layer between the TBC and the environmental/bond coat and spallation due to thermally-induced stresses.

Solutions to this problem include formation of a diffusion barrier layer between the superalloy substrate and the bond coat and application of a platinum-group metal (PGM) bond coating over the base metal with or without a diffusion barrier layer. Because the chemical compositions of the bond coat and the superalloy substrate are significantly different, the driving forces (activation energies) for diffusion between superalloy substrates and metallic bond coats at the elevated temperatures of operation are very strong, so the solution is to prevent or significantly reduce the diffusion of elements from one to the other. U.S. Pat No. 6,933,052to Gorman et al. issued Aug. 23, 2005, assigned to the assignee of the present invention, is an example of such a solution, utilizing a diffusion barrier between the bond coat and the substrate which inhibits the diffusion of elements from the substrate to the bond coat. The diffusion barrier, a non-metallic oxide or nitride intermediate between the substrate and bond coat and overlying the bond coat, inhibits the diffusion of elements between the bond coat and substrate. The diffusion of elements across the diffusion barrier from either the superalloy substrate or the bond coat is significantly lowered. One of the limiting features of these solutions when using a PGM-based coating is continued diffusion of oxygen resulting in oxidation of either or both of the underlying base metal or diffusion barrier layer, the diffusion of oxygen continuing even while diffusion of other elements comprising the superalloy substrate or bond coat is lowered.

When a diffusion barrier is not utilized, a further limitation is caused by extensive Kirkendall voiding that is observed from the rapid interdiffusion of the PGM-based bond coat and the substrate. Coalescence of significant Kirkendall voids can result in spallation of the overlying protective bond coating, leaving the substrate material unprotected. Diffusion barriers that have been utilized have critical adhesion limitations with the substrate or limited environmental resistant that cannot tolerate oxygen ingress or any breach in the coating.

The present invention is designed to reduce the diffusion between a bond coat and a superalloy substrate, but utilizes a different approach.

SUMMARY OF THE INVENTION

The present invention reduces diffusion between an environmental bond coat and a superalloy substrate using a modified platinum group metal as the bond coat. By reducing diffusion, depletion of active elements between the substrate and the coating can be reduced. This, in turn, reduces spallation of the coating, thickening of the thermally grown diffusion layer and formation of detrimental SRZ's. The platinum group metal coating material was modified to include, in solid solution, elements of the superalloy substrate. As most of the superalloy substrates used for service in the hot turbine section of turbine engines utilize high temperature superalloys, the platinum group metal coating material of the present invention was modified to include nickel (Ni) and/or cobalt (Co). But the platinum group metal coating material, in order to be effective, was modified based on the chemical composition and chemical activity of the substrate material, as will become clear. Thus, depending on the substrate material, the modified platinum group metal coating material may not even include Ni or Co, but may be modified to include amounts of different elements that are consistent with the chemical composition of the substrate. The platinum metal coating material was also modified to include aluminum (Al), both because the element is included in high temperature superalloy composition substrates and because the element is important in developing high temperature environmental protection. The aluminum contributes to the formation of an alumina-rich thermally grown oxide that forms at the surface of the coating when the coating is an environmental coating, or which forms as an interface between the bond coat and a thermal barrier coating when the latter is applied over the platinum metal coating.

The modified platinum group metal coating composition was developed to be applied as a solid solution, so that the coating, as applied, comprises a phase having a face-centered cubic (fcc) crystal structure, also referred to as a gamma (γ) phase material, rich in platinum group materials. It may include small amounts of a second phase isolated within the fcc phase matrix, as some intermetallics may inevitably be driven to form based on free energy considerations. In addition, since the coating material derives some of its desirable environmental properties from aluminum, some aluminum oxide ($Al_2O_3$) forms on the surface of the bond coat, either at the interface with the hot gas environment or with a subsequent overcoat, such as a TBC. The alumina is thermally grown, but because the coating has reduced diffusion of elements, and the thermal expansion is more closely matched to the bond coat, the oxide is more adherent.

While the broadest embodiment of the invention envisions a fcc phase solid solution platinum-group alloy that includes important elements from the substrate in the applied coating, a broad embodiment of the present invention used with superalloys such as used in gas turbine engines includes, in atomic percent (a/o), Ni from about 10-45 a/o, up to about 20 a/o of elements selected from the group consisting of chromium (Cr), Co, tantalum (Ta), tungsten (W), rhenium (Re), ruthenium (Ru), molybdenum (Mo), niobium (Nb), titanium (Ti) and combinations thereof, the total of Ni and elements selected from the group of elements listed above being no more than about 50 a/o, aluminum, from about 5-30 a/o, and the balance a PGM element, but comprising at least about 40 a/o of the total. In addition, a small amount of reactive elements, such as Zr, Hf, Y and rare earth elements may be included up to about 2 a/o. The rare earth elements are found on the periodic table as having atomic numbers from 58 through 71 and include Ce, Pr, Nd, Sm, Eu, Gd, Tb, Dy, Ho, Er, Tm, Yb, and Lu. Unless otherwise specified, coating compositions are provided in atomic percentages.

Unlike other proposed solutions to the problems of spalling that form aluminides and diffusion barriers, the present invention utilizes substantially a single phase γ solution of platinum group metal. This γ-phase solution encompasses, in atomic percent, a fairly broad range of platinum-group material. In addition, at the temperatures of operation of the turbine section, Pt has high solubility of Al and Ni. Other elements can be added to this γ-phase, also in a fairly broad range. It should be noted that this γ-phase solution is different from β-phase intermetallics that are identified as platinum aluminum coatings, platinum aluminides, platinum-modified nickel aluminides and the like. These coatings typically are β-phase intermetallic structures of the type (Pt,Ni)Al with a B2 crystal structure. Such β-phase intermetallics are brittle and have a very narrow range of solubility. Because of their lower solubility, these intermetallics typically have a lower platinum content.

The present invention, being a γ-phase solid solution alloy, is not brittle, yet includes Al, which helps develop its environmental capabilities. Because the aluminum forms a thermally grown alumina, and because this coating is designed to retard diffusion, the aluminum oxide layer grows slowly.

Other features and advantages of the present invention will be apparent from the following more detailed description of the preferred embodiment, taken in conjunction with the accompanying drawings which illustrate, by way of example, the principles of the invention.

DETAILED DESCRIPTION OF THE INVENTION

Figure 1:
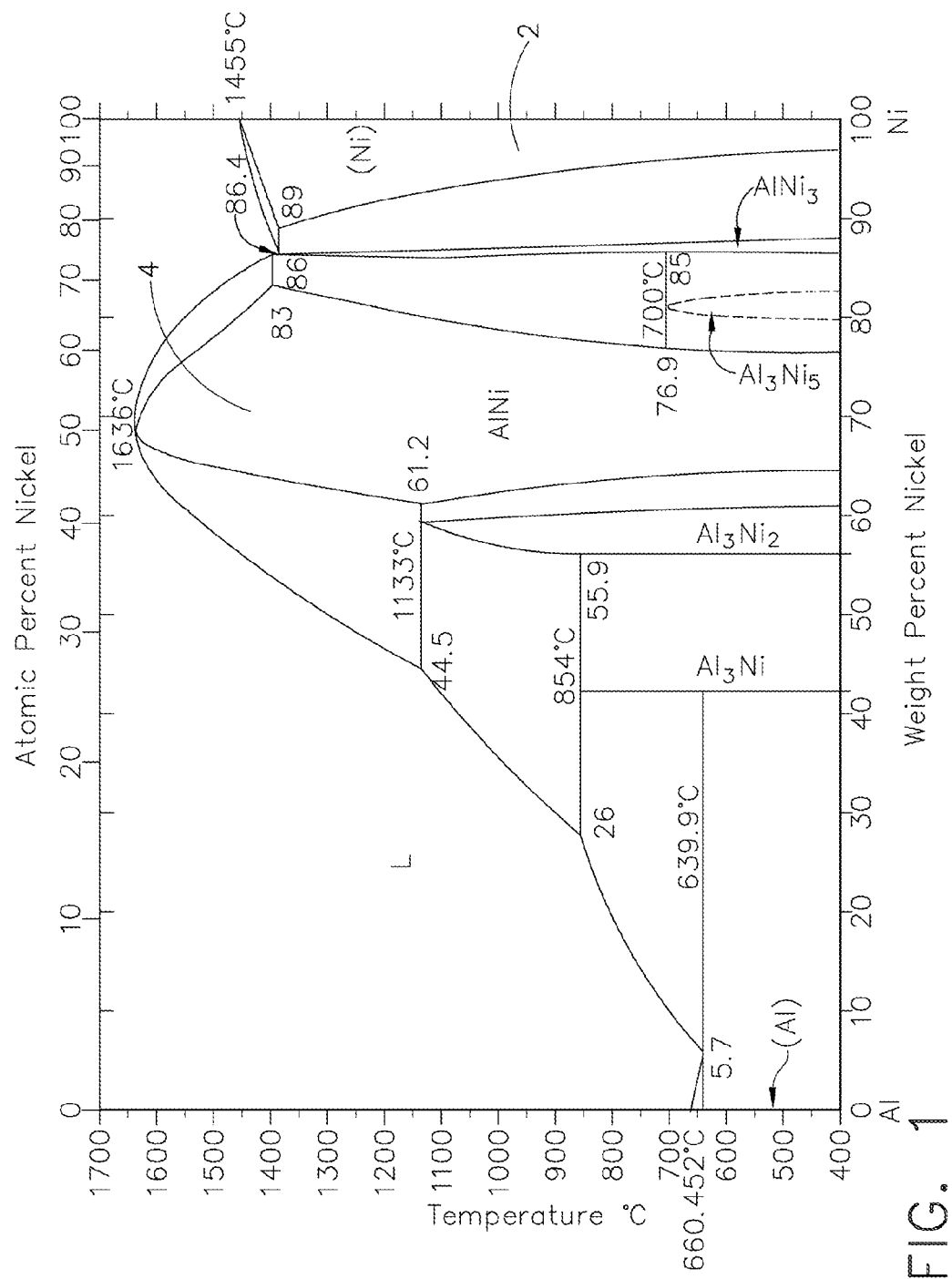
FIG. 1 is the binary phase diagram of the Ni—Al system.

FIG. 1 represents the Ni—Al binary phase diagram 2. Many of the so-called platinum aluminide coatings in use as bond coatings and environmental coatings are in fact beta phase (β) nickel aluminides 4 modified by the addition of platinum substitutionally added for nickel. This β-phase is an intermetallics compound having a range of aluminum solubility, from about 47-60 a/o (in the binary composition). This β-phase NiAl intermetallics compound has the characteristics of intermetallics compounds, such as limited solubility of the elements comprising it and somewhat brittle in nature. The present invention, by contrast, is a coating having a high PGM content, and includes limited amounts of elements added to it, based on the elements from the substrate over which it is to be applied. Such substrates used in gas turbine engines include second generation nickel base superalloys, which include high percentages of Ni and Al, and which also includes Cr. Thus, when used with such a substrate, the coating of the present invention also includes Ni, Al and Cr.

Figure 2:
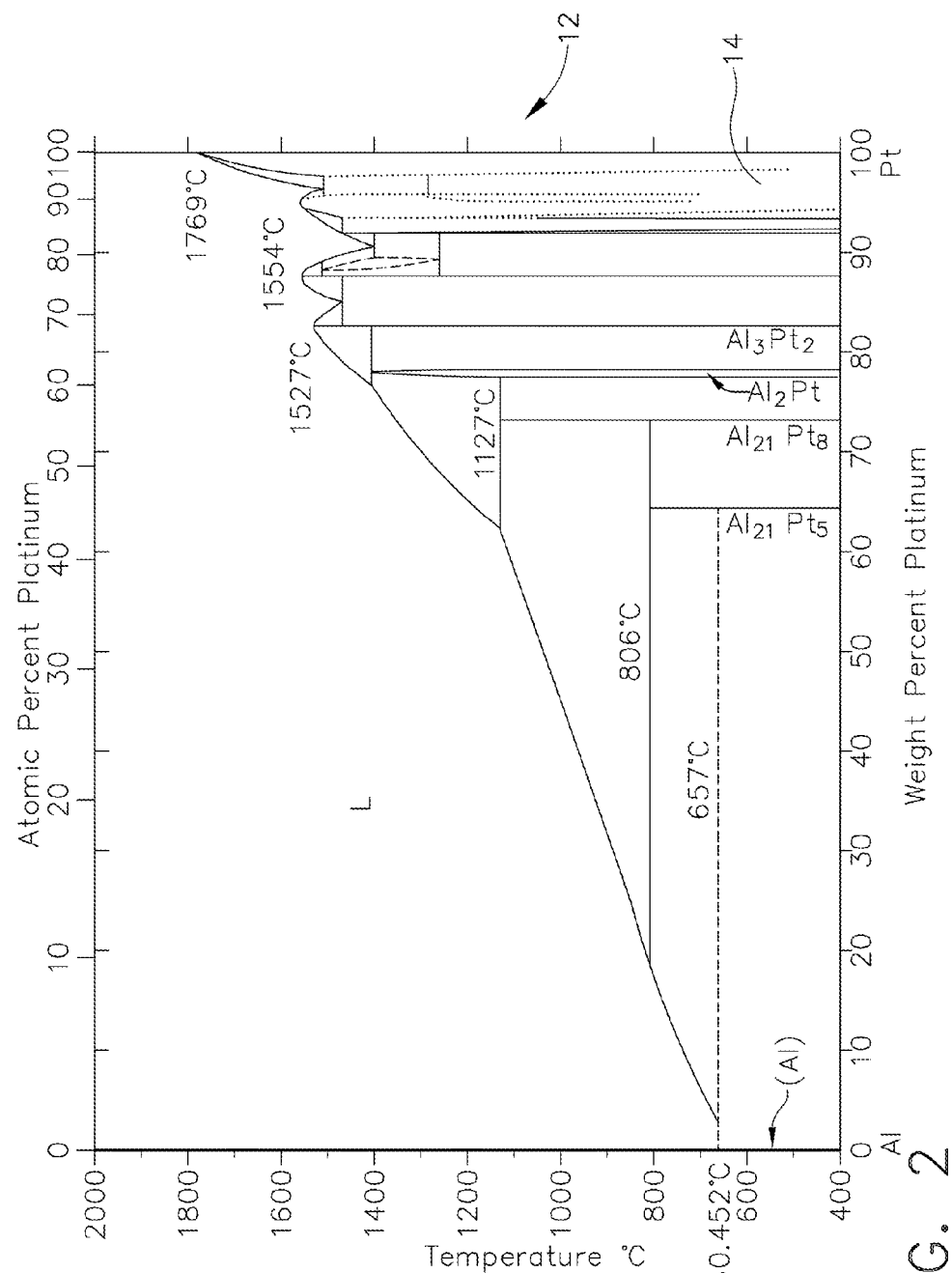
FIG. 2 is the binary phase diagram of the Pt—Al system.
Figure 3:
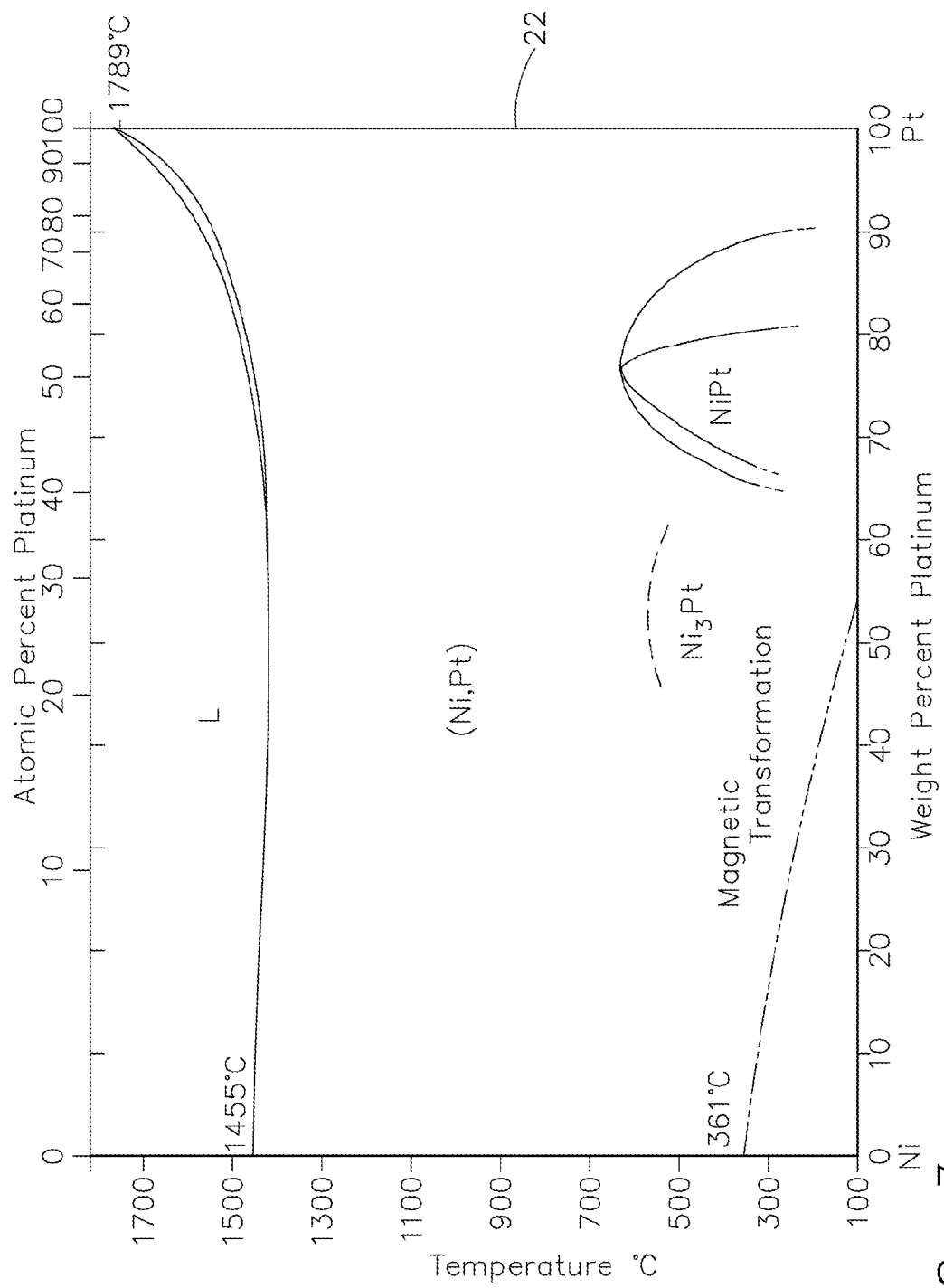
FIG. 3 is the binary phase diagram of the Pt—Ni system.

The present invention includes a high percentage of platinum group metals (PGM) which may include Pt, Rh, Pd, Ir, Ru and Os. FIG. 2 depicts the Pt—Al binary phase diagram 12. The γ phase 14 is a platinum rich solid solution phase that includes up to about 15 a/o Al in solution. FIG. 3 depicts the Pt—Ni binary phase diagram 22. This phase diagram displays substantially a complete solid solution of the two elements at elevated temperature. The substitution of Pd or Rh for Pt is expected to behave similarly. These phase diagrams provide some indication of how these elements interact with each other in binary systems. However, the coating of the present invention is best understood in terms of a Pt—Al—Ni ternary diagram.

Figure 4:
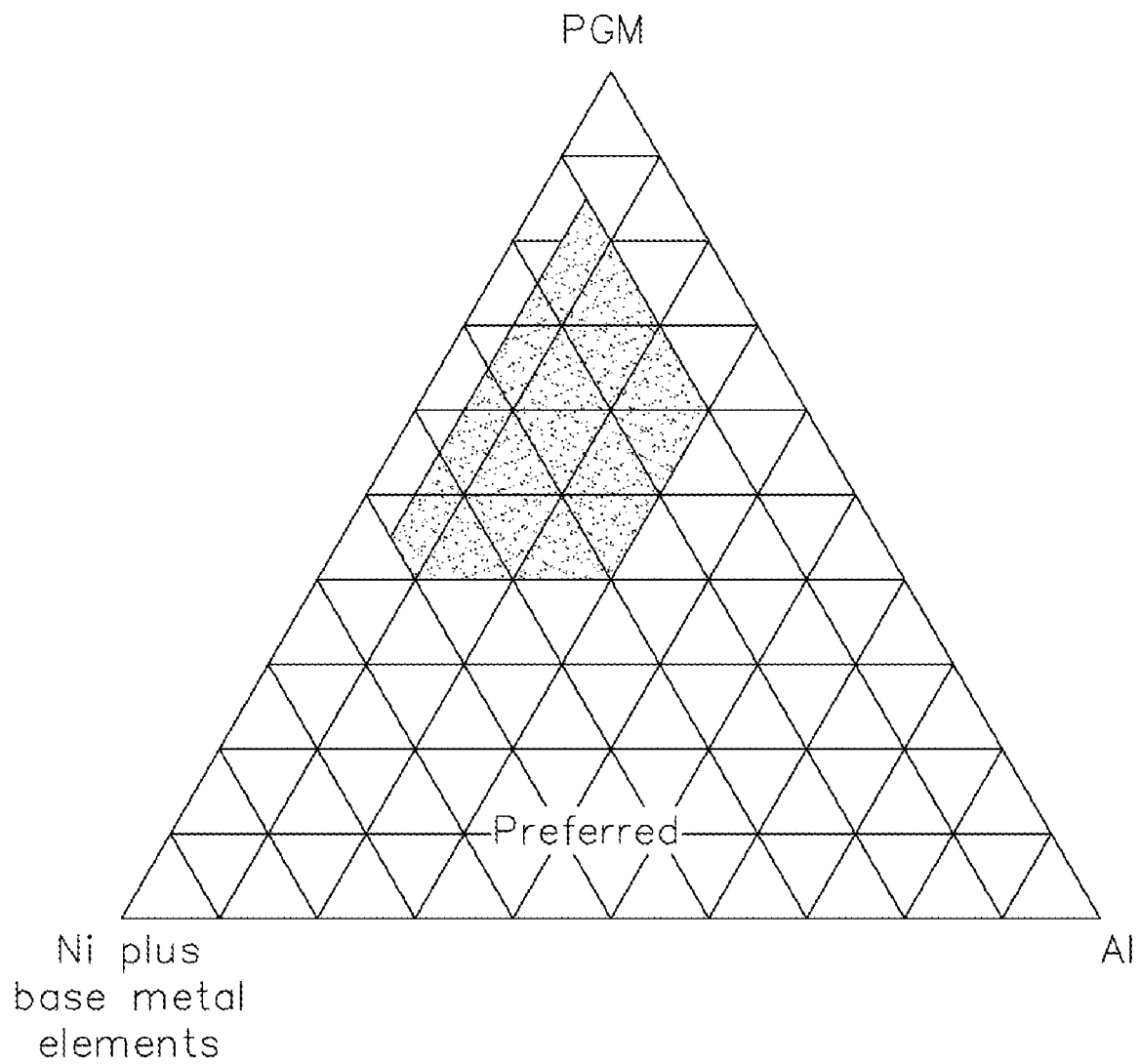
FIG. 4 is a ternary composition diagram of a Pt—Ni—Al system that includes some platinum group metals substituted for platinum and elements substituted for Ni. The shaded area represents the preferred composition of the coating.

FIG. 4 is a ternary composition diagram of a Pt—Ni—Al system that includes some platinum group metals (such as Rh) substituted for platinum and elements (such as Cr) substituted for Ni. The shaded area represents the preferred composition of the coating. This coating is formulated for application over a nickel base superalloy substrate such as René N5 or René N6, used for hot section turbine engine components. René N5 is a well-known nickel-base superalloy, having a nominal composition by weight of 7.5% Co, 7% Cr, 6.2% Al, 6.5% Ta, 5% W, 3% Re, 1.5% Mo, 0.15% Hf, 0.05% C, 0.004% B and the balance Ni and incidental impurities. René N6 is another well-known single crystal nickel-base superalloy, having a nominal composition, by weight, of about 4.5 percent chromium, about 12.5 percent cobalt, about 5.7 percent tungsten, about 7 percent tantalum, about 6.1 percent aluminum, about 6.2 percent rhenium, about 0.15 percent hafnium, about 0.05 percent carbon, about 0.004 percent boron, and the balance essentially nickel, and further characterized by improved environmental resistance and stress rupture resistance. The coating includes a high percentage of platinum group metals. As used herein, platinum group metals include not only Pt, but also rhodium (Rh), palladium (Pd) and iridium (Ir). The platinum group metal component comprises at least about 40 a/o of the coating composition and up to about 85 a/o of the coating composition, with (Pt+Rh) comprising at least about 50 a/o of the platinum group metal composition. These elements are preferred for their combination of oxidation resistance, diffusivity and thermal match with the superalloy substrate.

Ni is included in the coating composition from about 10 a/o to about 45 a/o, as it is the primary element in nickel base superalloys. In addition to Ni, other base metal constituents that may be included in the coating composition comprise Cr, Co, Ta, W, Re, Mo, Nb and Ti in amounts up to about 20 a/o. However, the total amount of Ni plus elements from the group consisting of Cr, Co, Ta, Re, W, Mo, Ru, Nb and Ti should not exceed about 50 a/o.

Al is included in the coating composition from about 5 a/o to about 30 a/o. Up to about 2 a/o reactive elements also may be included in the coating composition. These additional reactive elements are selected from the group consisting of zirconium (Zr), hafnium (Hf), yttrium (Y), cerium (Ce), lanthanum (La) and combinations thereof.

Diffusion is a temperature activated phenomenon driven by the gradient in chemical potential of the diffusing element. In prior art applications, the β-phase intermetallics compositions include a relatively high concentration of aluminum (about 50 a/o), as compared to the nickel base superalloy substrates over which they are deposited. For example René N6 includes about 5-7% Al by weight, preferably about 5.7% Al. The driving force behind diffusion is the high aluminum content in the β-phase intermetallics coating as compared to the aluminum content of the base metal substrate. Al, a rapidly diffusing element, is driven to achieve equilibrium between the substrate and the coating. Al also migrates outward toward the surface coating to form an oxide protective layer. The result is that there is diffusion of aluminum to the coating surface, where an alumina protective layer is formed, as well as into the substrate, where the additional aluminum concentration can lead to a secondary reaction zone (SRZ) in susceptible materials, which can lead to degradation of high temperature material properties of the substrate.

Figure 5:
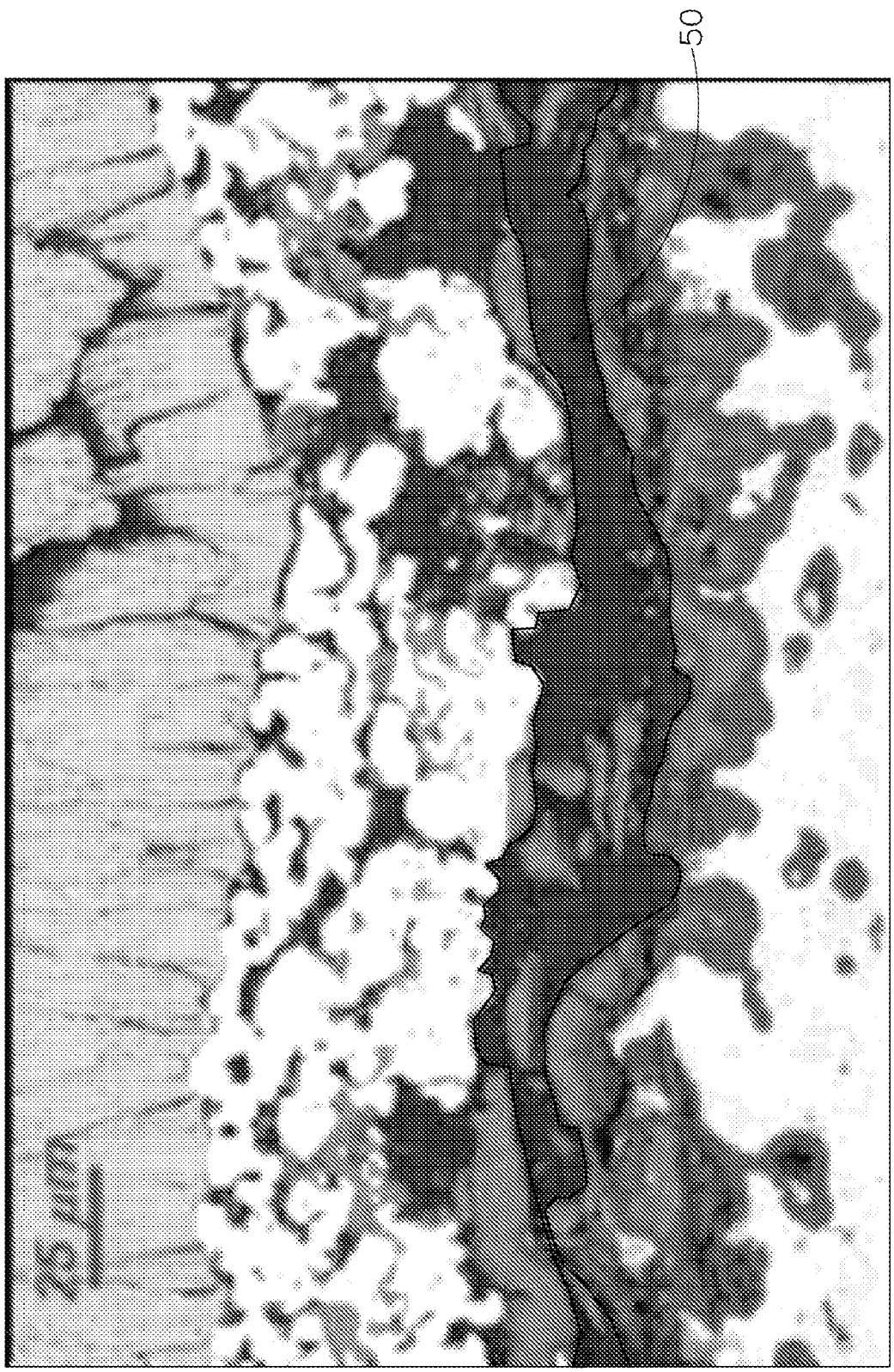
FIG. 5 is a photomicrograph of a prior art platinum-based bond coat depicting an oxide surface where spallation occurred.

Platinum group metal based bond coats are fcc-type alloys that include Pt. Without additional elements such as aluminum and chromium, oxygen diffusion through the bond coat results in subsequent oxidation of the base metal or of a diffusion barrier layer, when used. Spallation 50 can occur at this oxide interface as shown in FIG. 5.

Figure 6:
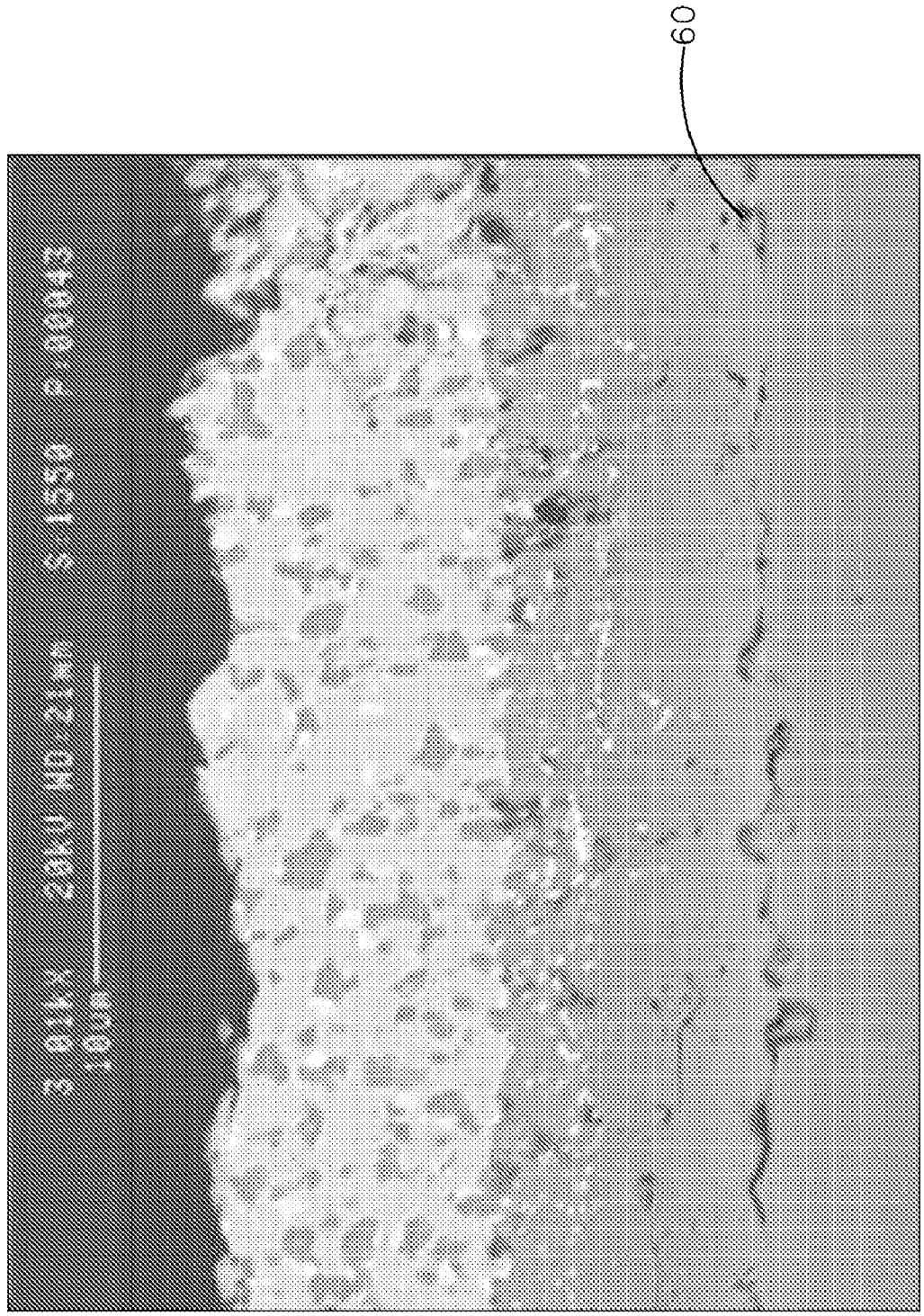
FIG. 6 is a photomicrograph of a prior art platinum-based bond coat depicting a line of Kirkendall voids where spallation occurred.

FIG. 6 depicts a spallation failure of a prior art platinum group metal (PGM)-based bond coat along a line of Kirkendall voids. Here, interdiffusion of elements between the substrate and the bond coat was so rapid that the line of Kirkendall voids 60 agglomerated into porosity that became the site of spallation.

The present invention includes not only a high atomic percentage of a platinum group metal, but also includes percentages of elements in the base metal sufficient to reduce the driving force for the diffusion of elements between the base metal and the coating. Thus, the degree and rate of interdiffusion between the substrate material, typically a superalloy, and the bond coat is slowed so that Kirkendall voiding is eliminated or greatly reduced and spallation does not occur. The composition of the present invention produces a solid solution γ phase that provides environmental resistance, but also more typically serves as a bond coat for a TBC, which, of course, is optional.

Figure 7:
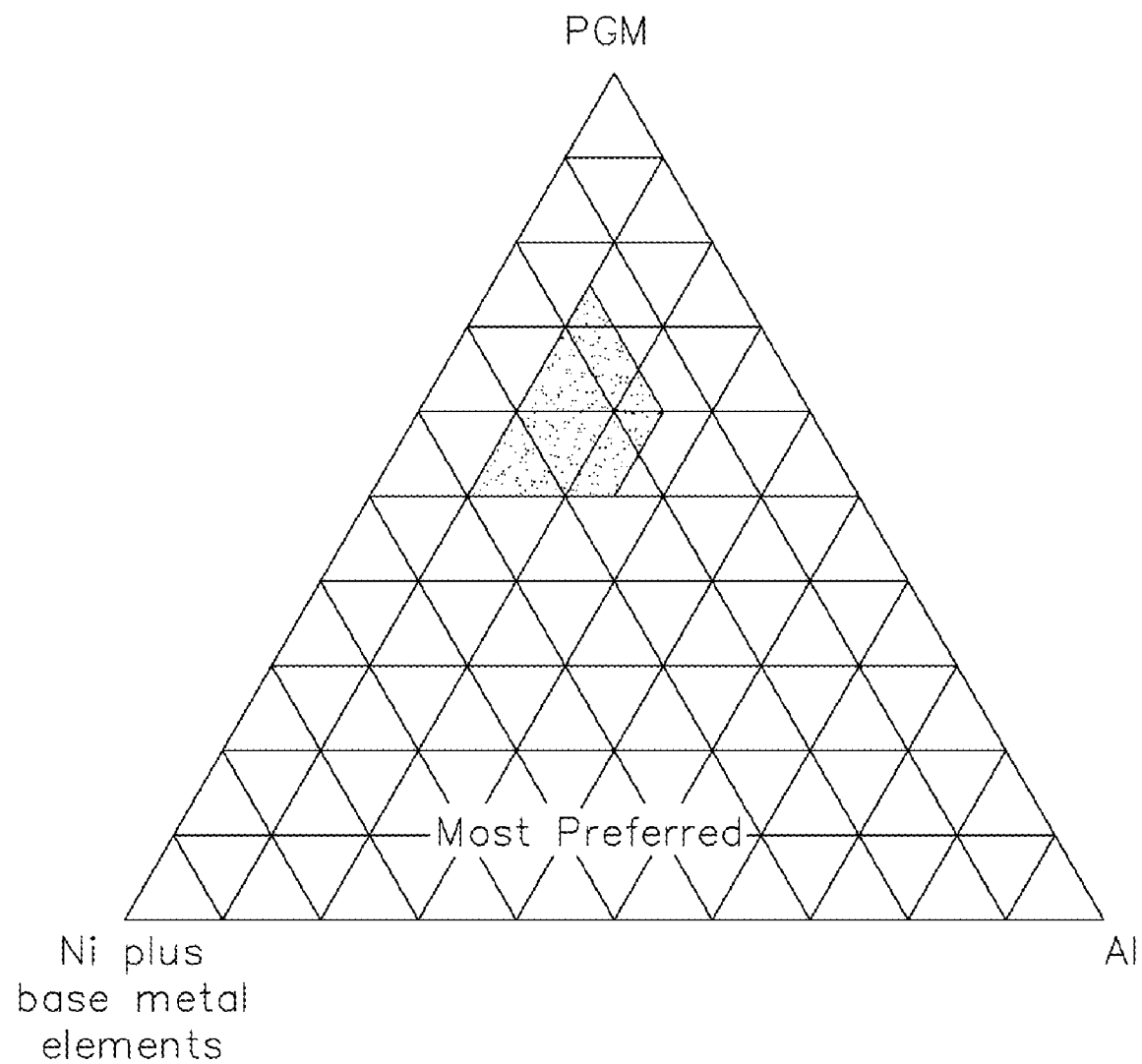
FIG. 7 is a ternary composition diagram of a Pt—Ni—Al system of FIG. 4 in which the shaded area represents the most preferred composition of the coating.

FIG. 7 is a cross-section of a ternary composition diagram of a Pt—Ni—Al system of FIG. 4 in which the shaded area represents the most preferred composition of the coating. This preferred composition was developed particularly for use with Ni-based superalloys such as René N5 and René N6, although it is suitable for use with other superalloys and base materials such as Nb, Co, PGM and Mo based alloys. In this preferred embodiment, the platinum group metal content is greater than about 50 a/o. Again, at least about one half of the platinum group metal constituents are Pt+Rh. In this preferred embodiment, Ni is included in an amount from about 15-35 a/o and additional base metal constituents are included up to about 10 a/o. Aluminum is included from about 10-25 a/o, and reactive elements may be included up to about 2 a/o.

The substantially fcc modified PGM coating of the present invention is applied over a substrate to a thickness of 5-60 microns μ. Selection of coating thickness will depend on the service conditions anticipated, such as maximum temperature, time at temperature and application of an optional diffusion barrier between the substrate and the modified PGM coating, but preferably, a thickness of 15-50 microns μ may be used. Any acceptable deposition method may be used to apply the coating. These include physical vapor deposition (PVD) processes such as sputtering, ion plasma deposition and EB-PVD. Alternate production processing may utilize entrapment electroplating techniques or thermal spray followed by a suitable heat treatment. Other production techniques envision application of Pt and/or Rh by electroplating, typically to thicknesses of 5-20μ followed by a suitable heat treatment. Suitable heat treatments are typically in the range of about 1600-2100° F. for about 2 hours. Such heat treatments not only interdiffuse the elements, but also enhance the bonding to the substrate and reduce stresses. This in turn is followed by application of the other constituents by PVD processes such as ion plasma deposition (also referred to as cathodic arc) to a thickness of about 5-10μ followed by another suitable heat treatment to fully develop the coating. The applied coatings may be by sequential deposition or simultaneous deposition of the constituent elements. The compositions of the present invention result in a coating of a substantially PGM-rich fcc single phase, as there is insufficient Al and Ni in the composition to result in formation of a β-phase (Pt)NiAl. However, depending on the overall composition, it is possible that rhodium aluminide may form. In this circumstance, the coating has two phases, the primary phase being the fcc-phase with Rh aluminide having a B2 structure distributed in the primary fcc-phase.

An optional topcoat of a TBC may be applied over the modified PGM coating. While any suitable thermal barrier material, typically high temperature oxides, may be used, stabilized zirconia TBC's are typically applied by a thermal spray or by a PVD process. Zirconia stabilized with 7% yttria (by weight) is currently the preferred TBC, also referred to as 7YSZ. TBC's with reduced conductivity compared to 7YSZ may also be used, such as zirconia modified with the addition of rare earth oxides.

EXAMPLE 1

A modified PGM coating is applied to a René N5 turbine blade by using a sputter deposition process. The modified PGM coating has a composition of 10 a/o Rh, 40 a/o Pt, 25 a/o Ni, 20 a/o Al, and 5 a/o Cr. The low levels of Cr, Ni and Al suppress the formation of oxide at the platinum-rich surface. After deposition, the coated turbine blade is heat treated in a vacuum for about one hour at about 1800° F.

EXAMPLE 2

An oxide nitride carbide coating is applied to a René N6 turbine blade as a diffusion barrier as set forth in U.S. Pat. No. 6,933,052, incorporated herein by reference. This diffusion barrier is applied to a thickness of about 2μ. A modified PGM coating is then applied over the diffusion barrier to a thickness of about 50μ by ion plasma deposition. The modified PGM coating has a composition of 50 a/o Rh, 20 a/o Pt, 15 a/o Ni, 10 a/o Al, and 5 a/o Cr. After deposition, the coated turbine blade is heat treated in a vacuum for about two hours at about 2000° F.

EXAMPLE 3

Figure 8:
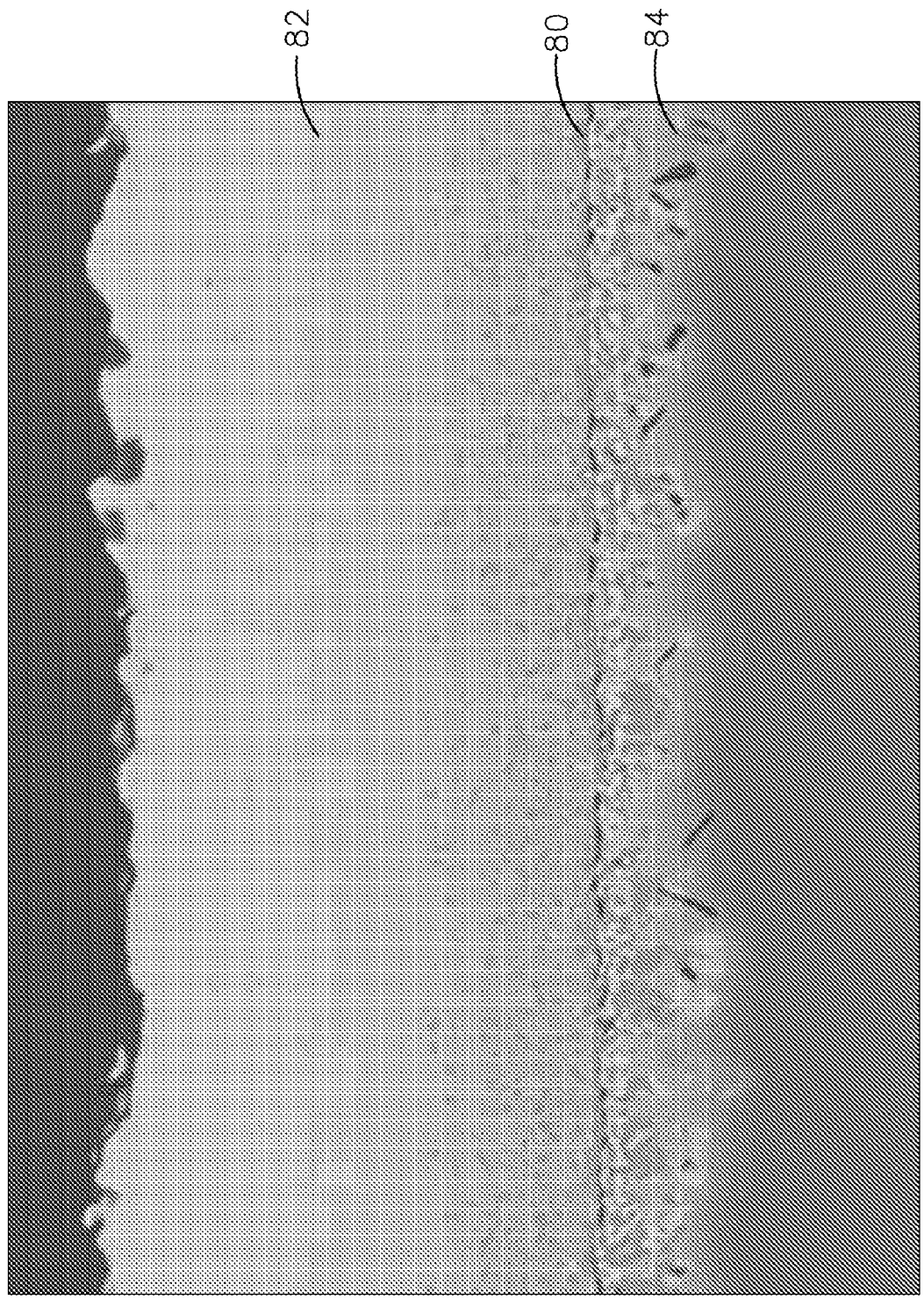
FIG. 8 is a photomicrograph of a coating having a composition of the present invention after an initial heat treatment of 1800° F. Followed by a thermal exposure of 2000° F. for two hours.
Figure 9:
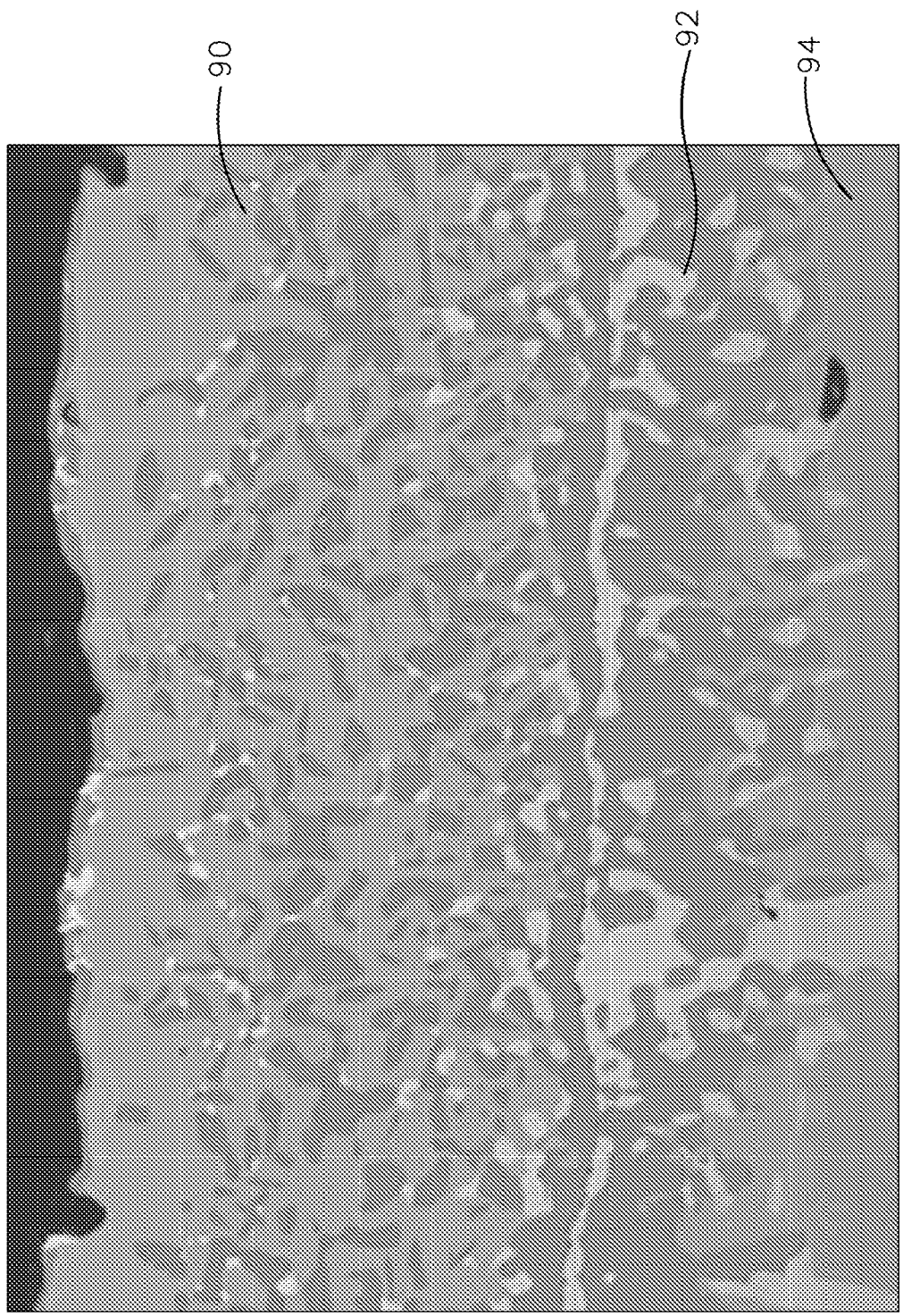
FIG. 9 is a photomicrograph of a coating having a composition of the present invention after an initial heat treatment of 1800° F., followed by an additional thermal exposure of 2200° F. for 24 hours.

A modified PGM coating was applied to a René N5 sample by ion plasma deposition. The coating was heat treated for about one hour at 1800° F. in a vacuum. The composition of the coating after heat treatment, measured by microprobe, was found to be, in atomic percent, about 15.85% Ni, about 2.27% Cr, about 5.76% Al, about 27.21% Pt, and about 48.36% Rh. Other elements are or may be present, but in amounts below the detectability limits of the measuring instrument. The composition contained insufficient amounts of Ni and Al to form the β-phase NiAl intermetallic. Thermal exposures were then conducted by raising the temperature to 2000° F. for about 2 hours. The microstructure is shown in FIG. 8. The bond line 80 between the coating 82 and the substrate 84, René N5, can be seen, but there is no spallation and little observable Kirkendall voiding. The sample was then thermally exposed to a temperature of 2200° F. for about 24 hours. The microstructure shown in FIG. 9 is a two phase microstructure. The blocky portions 92 forming within the coating 90, and the coating at the coating surface and at the interface with the substrate 94 are rhodium aluminide (RhAl), which is interspersed within the fcc matrix of the modified PGM-based coating.

A similar sample was also coated with a TBC, yttria-stabilized zirconia applied by EB-PVD, and furnace cycle spallation tested at 2175° F. until failure. The results were compared against PtAl samples processed with it. The life of the modified PGM coating of the present invention exceeded that of the PtAl samples. The sample of the present invention exhibited a 20% increase in furnace cycle life as compared to the PtAl baseline.

EXAMPLE 4

René N5 samples were sputter deposited with about 26.96 a/o Al, about 19.11 a/o Ni, about 7.22 a/o Cr, about 25.73 a/o Rh and the balance Pt. The coated samples were vacuum heat treated for about 2 hours at a temperature of about 2000° F., followed by a cyclic oxidation test at about 2150° F., the cyclic oxidation test comprising 20 cycles per hour. The testing in the cyclic oxidation test is continued until severe oxidation is determined to occur. This may be determined visually. A two phase structure as described above in example 3, similar to FIG. 9 was formed. The samples coated in accordance with the present invention had an average life of greater than 2000 hours, whereas similarly processed baseline PtAl-coated samples had an average life of about 460 hours.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A material system comprising:
   a superalloy substrate;
   a modified platinum group metal coating, the coating further comprising, in atomic percent,
      about 5-30 a/o Al,
      about 10-45 a/o Ni,
      up to about 20 a/o of an element selected from the group consisting of Cr, Co, Ta, W, Re, Ru, Mo, Nb, Ti and combinations thereof,
      up to about 2 a/o of an element selected from the group consisting of Zr, Hf, Y, rare earth elements and combinations thereof,
      the balance being a platinum group metal, the balance comprising not less than about 40 a/o and not more than 85 a/o, wherein a platinum group metal consists of at least one element selected from the group consisting of Pt, Rh, Pd and Ir,
      wherein the total amount of Ni and elements selected from the group consisting of Cr, Co, Ta, W, Re, Ru, Mo, Nb, Ti and combinations thereof comprise no more than 50 a/o of the coating, and
      wherein the as-deposited coating is a substantially face centered cubic solid solution structure;
   a diffusion barrier layer, wherein the diffusion barrier is intermediate the substrate and the modified platinum group metal coating; and
   wherein the diffusion barrier layer is an oxide based coating.

2. The system of claim 1
   wherein the superalloy substrate is a nickel-base superalloy article consisting essentially of, in percentages by weight, 5-10% Co, 5-10% Cr, 5-7% Al, 3-8% Ta, 3-8% W, 0-6% Re, 0-2% Mo, 0.08-0.2% Hf, 0.03-0.07% C, 0.0030.006% B, 0-2% Ti, 0-0.04% Y, the balance Ni and incidental impurities, and
   wherein the modified platinum group coating further comprises, after a vacuum heat treatment for one hour at about 1800° F., about 15.85 a/o Ni, about 2.27 a/o Cr, about 5.76 a/o Al, about 27.21 a/o Pt and about 48.36 a/o Rh.

3. The system of claim 1 wherein the the base material comprising the superalloy substrate is selected from the group consisting of Ni, Fe, Co and combinations thereof.

4. The system of claim 1 wherein the superalloy substrate is a Ni-based superalloy substrate.

5. The system of claim 1 wherein the rare earth elements in the group consisting of Zr, Hf, Y, rare earth elements and combinations include La and Ce.

6. The system of claim 1 wherein the modified platinum group metal coating is applied to a thickness of about 5-60 microns.

7. The system of claim 1 further including a thermal barrier coating layer overlying the modified platinum group metal coating, the thermal barrier coating forming the outermost layer of the coating system.

8. The system of claim 1 wherein the superalloy substrate is a component of a gas turbine engine.

9. The system of claim 1 wherein the superalloy substrate is a turbine airfoil.

10. The system of claim 1 wherein the superalloy substrate has a composition, by weight, of the substrate has a composition, by weight, of about 7.5% Co, about 7% Cr, about 6.2% Al, about 6.5% Ta, about 5% W, about 3% Re, about 1.5% Mo, about 0.15% Hf, about 0.05% C, about 0.004% B, the balance Ni and incidental impurities, and wherein the modified platinum group coating further comprises about 10 a/o Rh, about 40 a/o Pt, about 25 a/o Ni, about 20 a/o Al, and 5 about a/o Cr.

11. The system of claim 1
wherein the superalloy substrate comprises a composition, by weight, of about 12.5% Co, about 4.5% Cr, about 5.7% W, about 6.1% Al, about 7% Ta, 5.6% W, about 6.2% Re, 0.95% Mo, about 0.15% Hf, about 0.05% C, about 0.004% B, the balance essentially Ni and incidental impurities, and further characterized by improved environmental resistance and stress rupture resistance, and wherein the modified platinum group metal coating further comprises about 50 a/o Rh, about 20 a/o Pt, about 15 a/o Ni, about 10 a/o Al, and about 5 a/o Cr.

12. The system of claim 1 wherein the diffusion barrier layer has a thickness of about 2μ.

13. The system of claim 1 wherein the superalloy substrate has a composition, by weight, of the substrate has a nominal composition, by weight, of about 7.5% Co, about 7% Cr, about 6.2% Al, about 6.5% Ta, about 5% W, about 3% Re, about 1.5% Mo, about 0.15% Hf, about 0.05% C, about 0.004% B, the balance Ni and incidental impurities, and wherein the modified platinum group metal coating further comprises, after a vacuum heat treatment for one hour at about 1800° F., about 15.85 a/o Ni, about 2.27 a/o Cr, about 5.76 a/o Al, about 27.21 a/o Pt and about 48.36 a/o Rh.

14. The system of claim 1 wherein the substrate has a composition, by weight, of about 12.5% Co, about 4.5% Cr, about 5.7% W, about 6.1% Al, about 7% Ta, 5.6% W, about 6.2% Re, 0.95% Mo, about 0.15% Hf, about 0.05% C, about 0.004% B, the balance essentially Ni and incidental impurities, and further characterized by improved environmental resistance and stress rupture resistance, and wherein the modified platinum group coating further comprises about 26.96 a/o Al, about 19.11 a/o Ni, about 7.22 a/o Cr, about 25.73 a/o Rh and the balance Pt.

* * * * *